US010559960B2

(12) United States Patent
Zhang

(10) Patent No.: US 10,559,960 B2
(45) Date of Patent: Feb. 11, 2020

(54) APPARATUS, DEVICE AND COMPUTER IMPLEMENTED METHOD FOR CONTROLLING POWER PLANT SYSTEM

(71) Applicant: GREENSMITH ENERGY MANAGEMENT SYSTEMS, INC., Herndon, VA (US)

(72) Inventor: Sen Zhang, Herndon, VA (US)

(73) Assignee: GREENSMITH ENERGY MANAGEMENT SYSTEMS, INC, Herndon, VA (US)

( * ) Notice: Subject to any disclaimer, the term of this patent is extended or adjusted under 35 U.S.C. 154(b) by 151 days.

(21) Appl. No.: 15/911,752

(22) Filed: Mar. 5, 2018

(65) Prior Publication Data
US 2019/0273382 A1 Sep. 5, 2019

(51) Int. Cl.
H02J 3/38 (2006.01)
H02M 3/145 (2006.01)
H02J 3/32 (2006.01)
H02M 1/00 (2006.01)
H01L 31/042 (2014.01)

(52) U.S. Cl.
CPC ............ H02J 3/385 (2013.01); H01L 31/042 (2013.01); H02J 3/32 (2013.01); H02M 1/00 (2013.01); H02M 3/145 (2013.01); H02M 2001/0067 (2013.01)

(58) Field of Classification Search
None
See application file for complete search history.

(56) References Cited

U.S. PATENT DOCUMENTS

| 9,257,849 | B2 | 2/2016 | Iino et al. | |
| 2007/0203860 | A1 | 8/2007 | Golden et al. | |
| 2011/0193515 | A1* | 8/2011 | Wu | H02J 7/35 320/101 |
| 2018/0054064 | A1* | 2/2018 | Narla | H02J 3/383 |
| 2018/0358839 | A1* | 12/2018 | Perez | H02J 9/061 |
| 2019/0089153 | A1* | 3/2019 | Miller | G06Q 50/06 |

OTHER PUBLICATIONS

T. Shimada et al., "Grid-Connected Photovoltaic Systems with Battery Storages Control Based on Insolation Forecastin Using Weather Forecast", Renewable Energy 2006 Proceedings, Jan. 2006, pp. 228-230, vol. 110, No. 4.

(Continued)

Primary Examiner — Mohammad Ali
Assistant Examiner — Sheela Rao
(74) Attorney, Agent, or Firm — Buchanan Ingersoll & Rooney PC

(57) ABSTRACT

A computer implemented method for controlling a power plant system comprising a photovoltaic power source, an inverter, a DC-to-DC converter, an energy storage and an energy storage manager, the method comprising: receiving target value for AC power to be supplied by the inverter; receiving weather forecast information, energy storage status information and photovoltaic power source parameters; generating forecasted energy flow information for the photovoltaic power source based on the weather information and the photovoltaic power source parameters; comparing the forecasted energy flow information and the energy storage status information; and adjusting the target value for the AC power based on the comparison.

14 Claims, 7 Drawing Sheets

(56) References Cited

OTHER PUBLICATIONS

International Search Report and Written Opinion of the International Searching Authority (Forms PCT/ISA/220, PCT/ISA/210 and PCT/ISA/237) dated May 16, 2019, by the International Bureau of U.S. Patent and Trademark Office in corresponding International Application No. PCT/US2019/20537. (9 pages).

\* cited by examiner

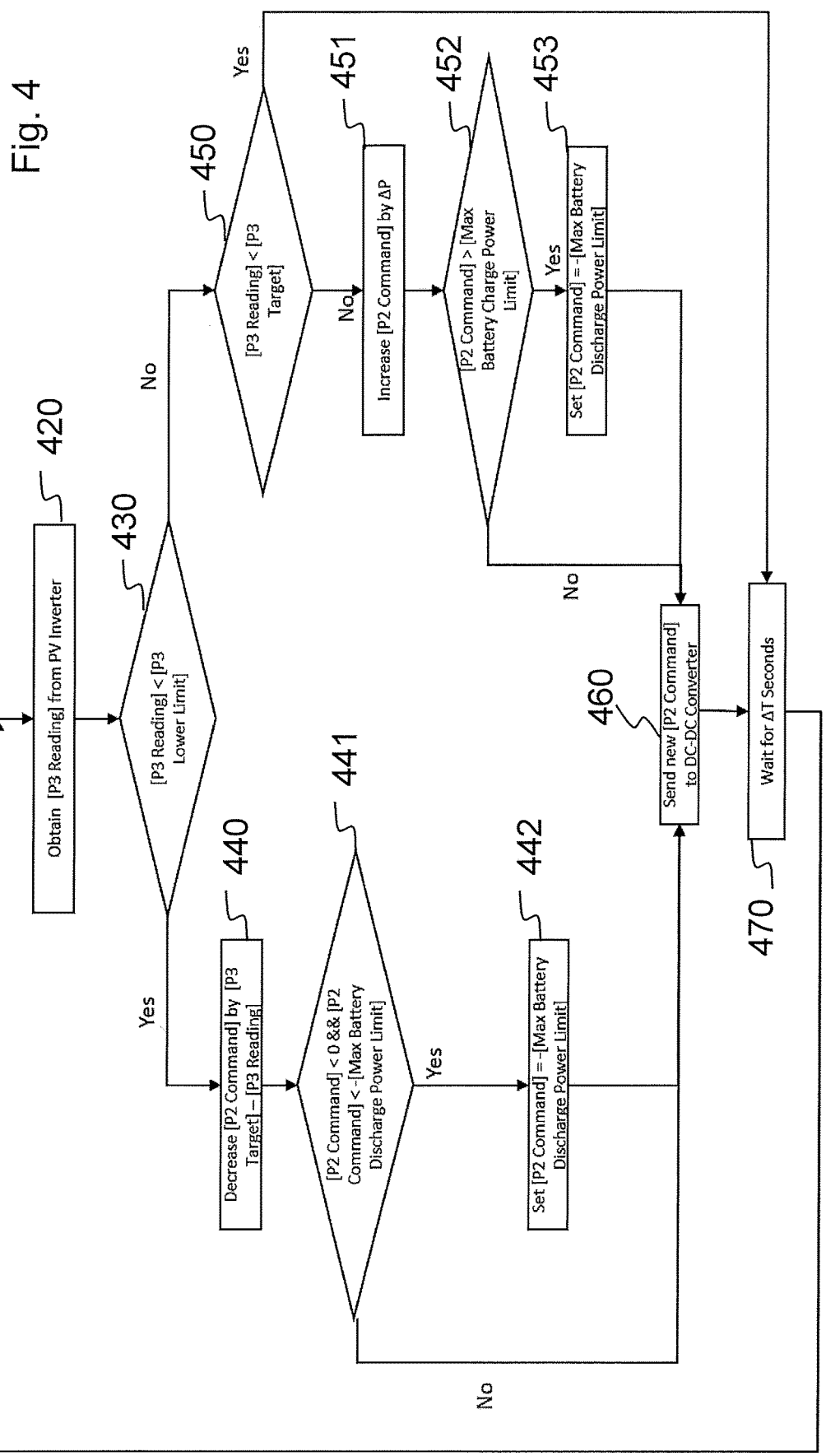

APPARATUS, DEVICE AND COMPUTER IMPLEMENTED METHOD FOR CONTROLLING POWER PLANT SYSTEM

TECHNICAL FIELD

The present application generally relates to an apparatus, a device, a method and software code for controlling a power plant system and/or an energy storage system. The present application further relates to a method, an apparatus and software code for integrating an energy storage system to a power plant system that includes a renewable energy source.

BRIEF DESCRIPTION OF RELATED DEVELOPMENTS

This section illustrates useful background information without admission of any technique described herein representative of the state of the art.

Modern energy storage systems are fundamentally changing the way the customers approach energy storage. Desired systems should accelerate deployment, reduce costs and risk associated with installing energy storage. A distributed energy storage platform may be bundled with the advanced software controls to optimize savings, aggregate distributed energy resources, fortify grid resiliency and reliability and integrate renewables, for example.

Delivery of stable power with unsurpassed performance and profitability with system modularity and intelligent control and data management increase the challenges even further.

One traditional approach for managing storage assets is to deploy a plant controller that interacts with the batteries and a power control system (PCS) layered on top of the battery management system (BMS). Known systems may also utilize a software-based controller.

Improved solutions are desired for some of the most critical challenges facing utilities: easing demands on aging infrastructure, adapting to a higher penetration of renewables, and improving grid reliability.

Thus, an easy to set-up, accurate, and highly functional and reliable solution is needed to provide improved power plant or energy storage system.

SUMMARY

According to a first example aspect of the disclosed embodiments there is provided a computer implemented method for controlling a power plant system comprising a photovoltaic power source, an inverter, a DC-to-DC converter, an energy storage and an energy storage manager, the method comprising:
  receiving target value for AC power to be supplied by the inverter;
  receiving weather forecast information, energy storage status information and photovoltaic power source parameters;
  generating forecasted energy flow information for the photovoltaic power source based on the weather information and the photovoltaic power source parameters;
  comparing the forecasted energy flow information and the energy storage status information; and
  adjusting the target value for the AC power based on the comparison.

In an embodiment, the photovoltaic power source is configured to provide photovoltaic DC power to a photovoltaic DC bus, and the inverter comprises a direct current (DC) power input operationally connected to the photovoltaic DC bus to receive photovoltaic DC power.

In an embodiment, the inverter comprises an alternating current (AC) power output for supplying AC power to an AC system.

In an embodiment, the DC-to-DC converter comprises a first direct current (DC) port to be operationally connected to the photovoltaic DC bus in parallel with the photovoltaic power source.

In an embodiment, the energy storage is operationally connected to a second direct current (DC) port of the DC-to-DC converter.

In an embodiment, the energy storage manager is operationally connected to the energy storage for monitoring and controlling the energy storage.

In an embodiment, the method further comprises:
  receiving inverter power output readings at both AC side and DC side from the inverter;
  determining a DC-DC converter power set point based on comparison of the inverter power output reading at AC side and the target value for the AC power; and
  transmitting the DC-DC converter power set point to the DC-DC converter for controlling charging or discharging the energy storage at the power set point.

In an embodiment, the method further comprises:
  defining AC power curtailment set point for the inverter as a maximum AC power output, wherein the inverter power output reading at AC side is configured to be divided into three zones comprising:
    a first zone defined between the AC power curtailment set point and the target value for the AC power;
    a second zone defined between the target value for the AC power and a lower limit value for inverter power output reading at AC side; and
    a third zone defined below the lower limit value for inverter power output reading at AC side.

In an embodiment, the method further comprises:
  when in the first zone, increasing the DC-DC converter set point to increase energy storage charge power to harvest more photovoltaic energy into the energy storage or decrease energy storage discharge power to reduce energy storage power output into an AC system;
  when in the second zone, maintaining the DC-DC converter set point; and
  when in the third zone, decreasing the DC-DC converter set point.

In an embodiment, the method further comprises:
  comparing the forecasted energy flow information and the energy storage status information to determine if the energy storage has enough capacity to accommodate forecasted energy flow, wherein
    if the forecasted energy flow information indicates positive forecasted energy flow and the energy storage has not enough available free capacity to accommodate the forecasted energy, then increasing the target value for the AC power; and
    if the forecasted energy flow information indicates negative forecasted energy flow and the energy storage has not enough available stored energy capacity to supply the forecasted energy, then decreasing the target value for the AC power.

In an embodiment, the method further comprises:
  receiving a spinning reserve value indicating amount of spinning reserve required;

determining initial target value for AC power base point by subtracting the spinning reserve value from a photovoltaic inverter rated power value;

comparing the forecasted energy flow information and the energy storage status information to determine if the energy storage has enough capacity to accommodate forecasted energy, wherein if the forecasted energy flow information indicates positive forecasted energy flow and the energy storage has not enough available free capacity to accommodate the forecasted energy, then increasing the target value for the AC power base point; and if the forecasted energy flow information indicates negative forecasted energy flow and the energy storage has not enough available stored energy capacity to supply the forecasted energy and the spinning reserve, then decreasing the target value for the AC power base point.

In an embodiment, the method further comprises:

receiving a frequency regulation value indicating a range of frequency regulation required;

determining initial target value for AC power by subtracting a half of the frequency regulation value from a photovoltaic inverter rated power value;

comparing the forecasted energy flow information and the energy storage status information to determine if the energy storage has enough capacity to accommodate forecasted energy, wherein if the forecasted energy flow information indicates positive forecasted energy flow and the energy storage has not enough available free capacity to accommodate the forecasted energy, then increasing the target value for the AC power; and if the forecasted energy flow information indicates negative forecasted energy flow and the energy storage has not enough available stored energy capacity to supply the forecasted energy and the spinning reserve, then decreasing the target value for the AC power.

In an embodiment, the method further comprises:

transmitting, to the energy storage manager, command to connect or disconnect battery strings of the energy storage to the DC bus;

receiving, from the energy storage manager, DC current limits in both charge and discharge directions in real time; and receiving, from the energy storage manager, battery status readings including at least one of the following: DC voltages and state of charge.

In an embodiment, the method further comprises:

transmitting at least one of remote stop command and start command to the DC-to-DC converter;

transmitting operation mode control commands to the DC-to-DC converter;

transmitting power set point or current set point to the DC-to-DC converter;

transmitting maximum DC current limits for the second direct current (DC) port in both charge and discharge directions to the DC-to-DC converter; and receiving, from the DC-to-DC converter, status information and power readings of a first direct current (DC) port and the second direct current (DC) port.

In an embodiment, the DC-to-DC converter is run in a current source mode and configured to follow voltage of a photovoltaic DC bus set by the inverter.

In an embodiment, the method further comprises:

transmitting at least one of remote stop command and start command to the inverter;

transmitting AC power curtailment set point to the inverter; and receiving inverter status information and power readings at both AC side and DC side from the inverter.

In an embodiment, the method further comprises:

transmitting, to the energy storage manager, command to connect or disconnect battery strings of the energy storage to the DC bus;

receiving, from the energy storage manager, DC current limits in both charge and discharge directions in real time; and receiving, from the energy storage manager, battery status readings including at least one of the following: DC voltages and state of charge.

In an embodiment, the method further comprises:

transmitting at least one of remote stop command and start command to the DC-to-DC converter;

transmitting operation mode control commands to the DC-to-DC converter;

transmitting power set point or current set point to the DC-to-DC converter;

transmitting maximum DC current limits for the second direct current (DC) port in both charge and discharge directions to the DC-to-DC converter; and receiving, from the DC-to-DC converter, status information and power readings of a first direct current (DC) port and the second direct current (DC) port.

According to a second example aspect of the disclosed embodiments there is provided a controller apparatus for controlling a power plant system comprising a photovoltaic power source, an inverter, a DC-to-DC converter, an energy storage and an energy storage manager, the controller apparatus comprising:

a communication interface configured to transceive information with the inverter, the DC-to-DC converter and the energy storage manager;

at least one processor; and at least one memory including computer program code;

the at least one memory and the computer program code configured to, with the at least one processor, cause the apparatus to:

receive target value for AC power to be supplied by the inverter;

receive weather forecast information, energy storage status information and photovoltaic power source parameters;

generate forecasted energy flow information for the photovoltaic power source based on the weather information and the photovoltaic power source parameters;

compare the forecasted energy flow information and the energy storage status information; and adjust the target value for the AC power based on the comparison.

According to a third example aspect of the disclosed embodiments there is provided a power plant system comprising:

a photovoltaic power source to provide photovoltaic DC power to a photovoltaic DC bus;

an inverter comprising a direct current (DC) power input operationally connected to the photovoltaic DC bus to receive photovoltaic DC power, and an alternating current (AC) power output for supplying AC power to an AC system;

a DC-to-DC converter comprising a first direct current (DC) port to be operationally connected to the photovoltaic DC bus in parallel with the photovoltaic power source;

an energy storage operationally connected to a second direct current (DC) port of the DC-to-DC converter;

an energy storage manager operationally connected to the energy storage for monitoring and controlling the energy storage; and a controller apparatus coupled to the inverter, the DC-to-DC converter and the energy storage manager, configured to:

receive target value for the AC power to be supplied for the AC system;

receive weather forecast information, energy storage status information and photovoltaic power source parameters;

generate forecasted energy flow information for the photovoltaic power source based on the weather information and the photovoltaic power source parameters;

compare the forecasted energy flow information and the energy storage status information; and adjust the target value for the AC power based on the comparison.

Different non-binding example aspects and embodiments of the disclosure have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

The aspects of the disclosed embodiments will be described, by way of example only, with reference to the accompanying drawings, in which:

FIG. 4 shows a flow diagram of an exemplary method for a control flow relating to DC-to-DC converter in accordance with an example embodiment;

Figure 5A:
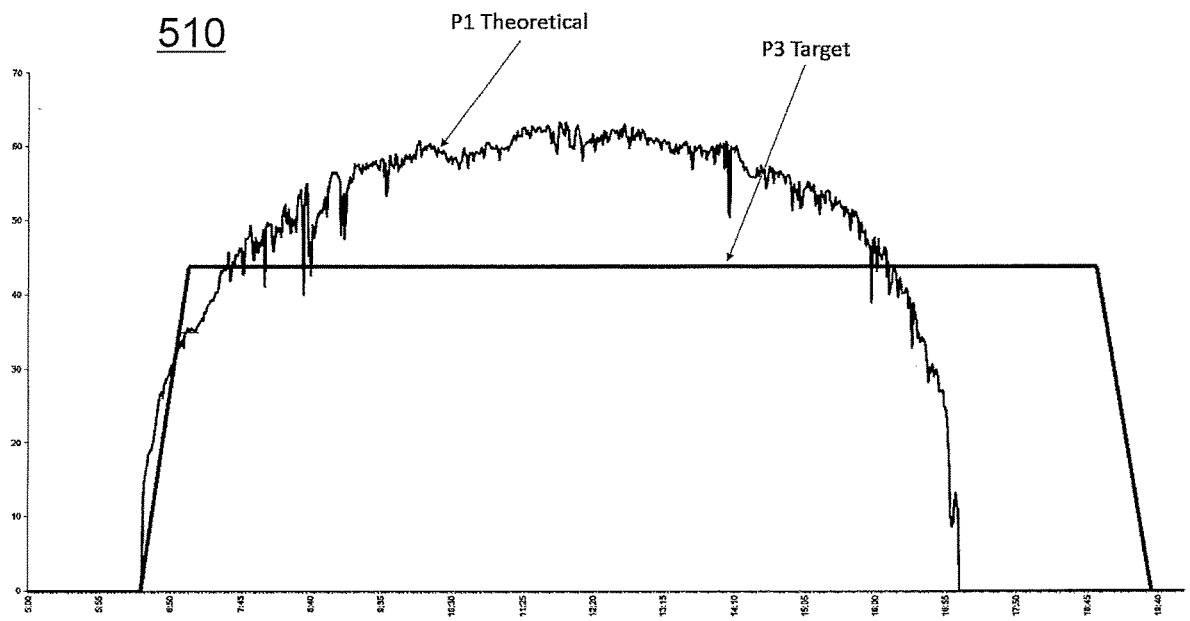
Figure 5B:
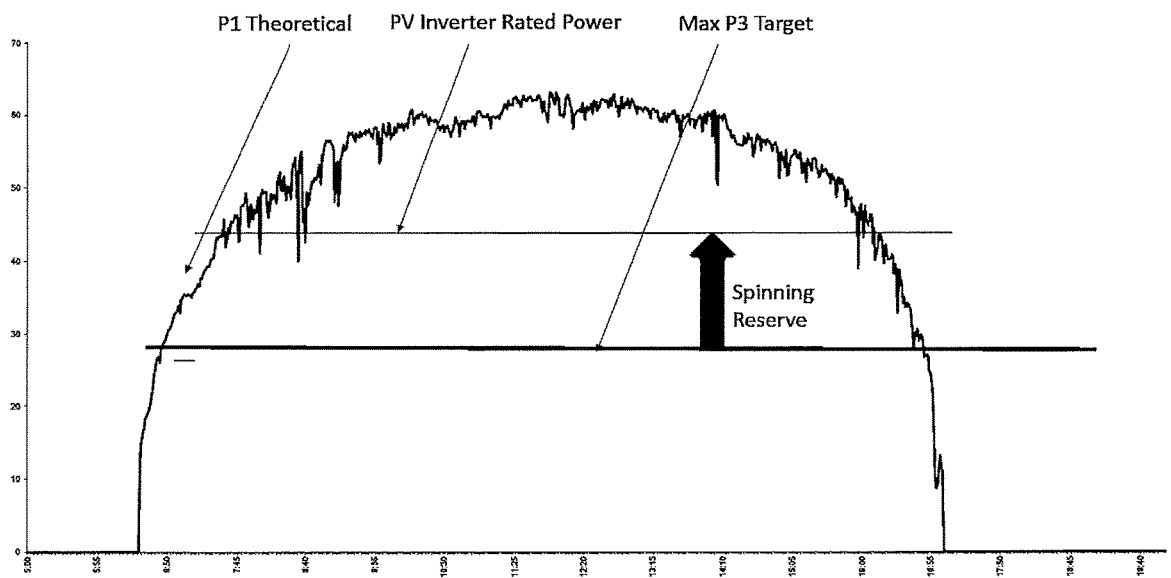
Figure 5C:
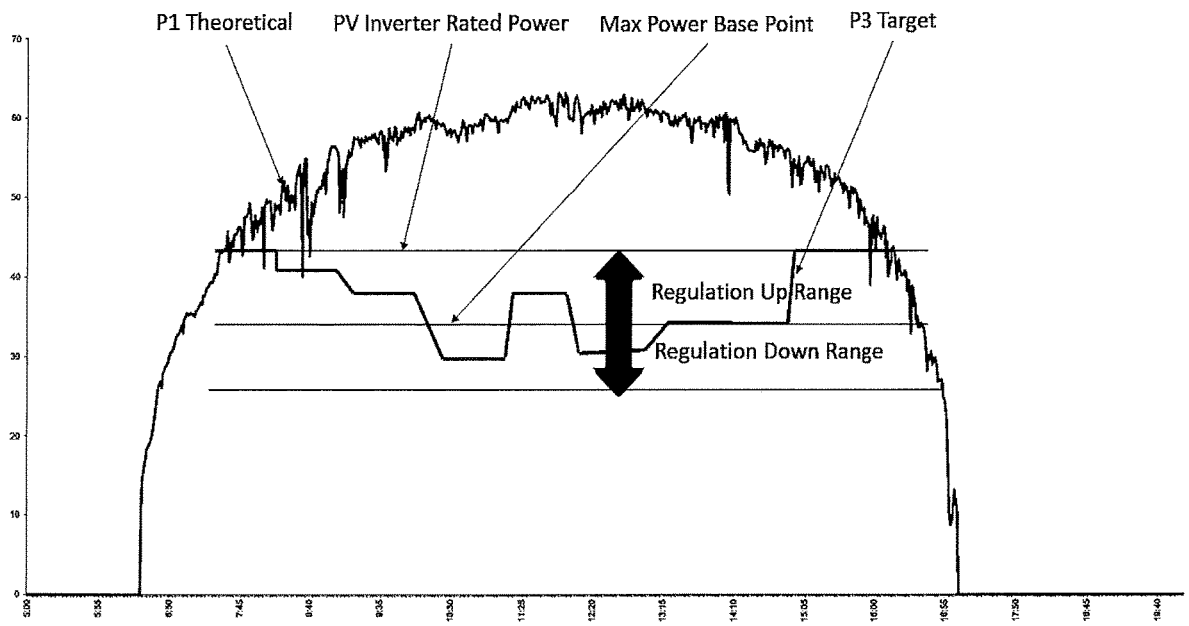
Figure 6:
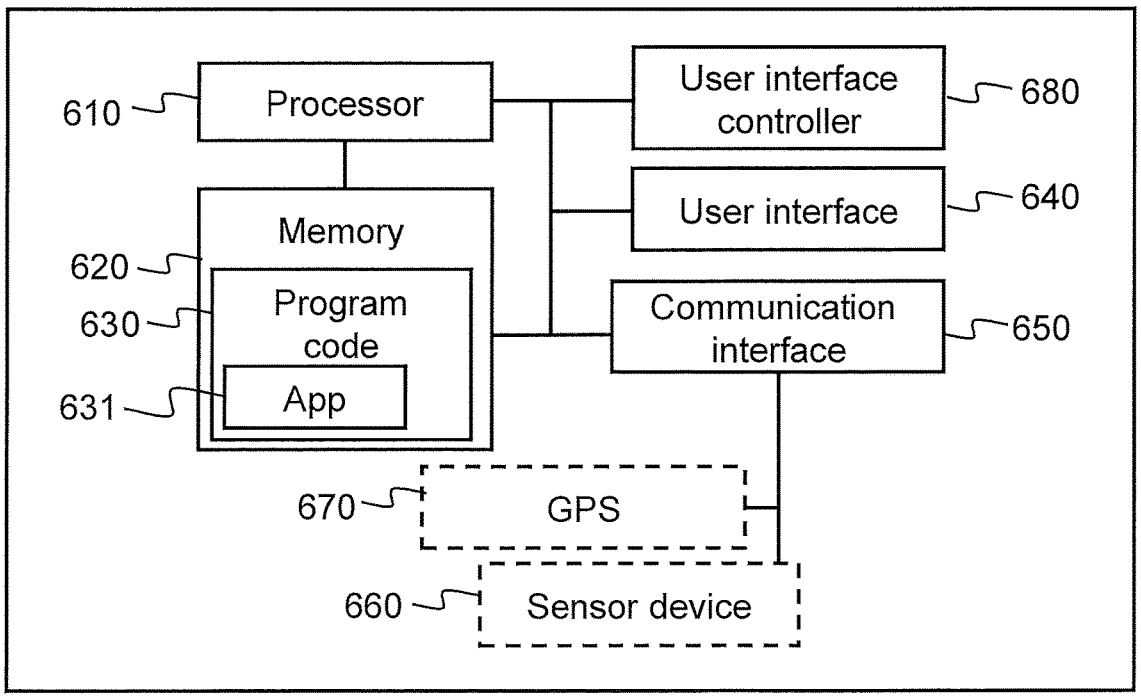
Figure 7:
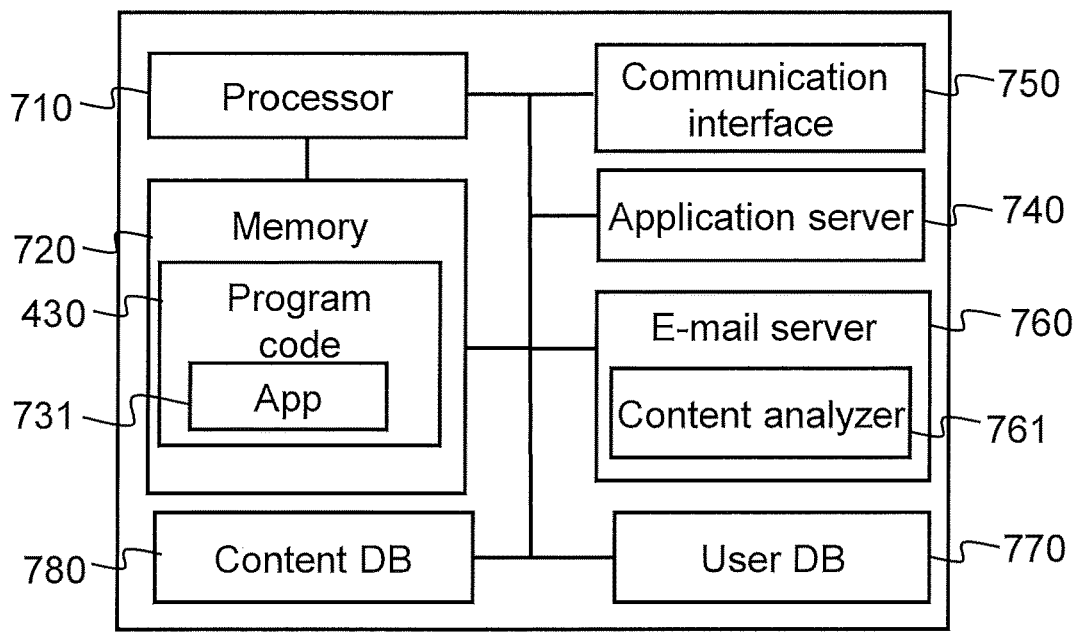
Figure 8:
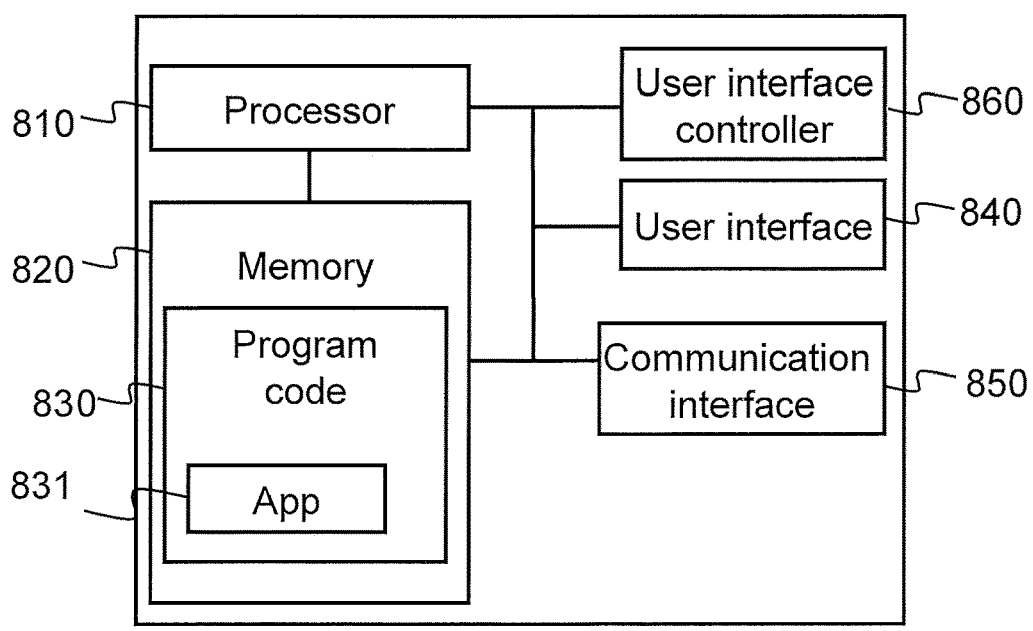
Figure 9:
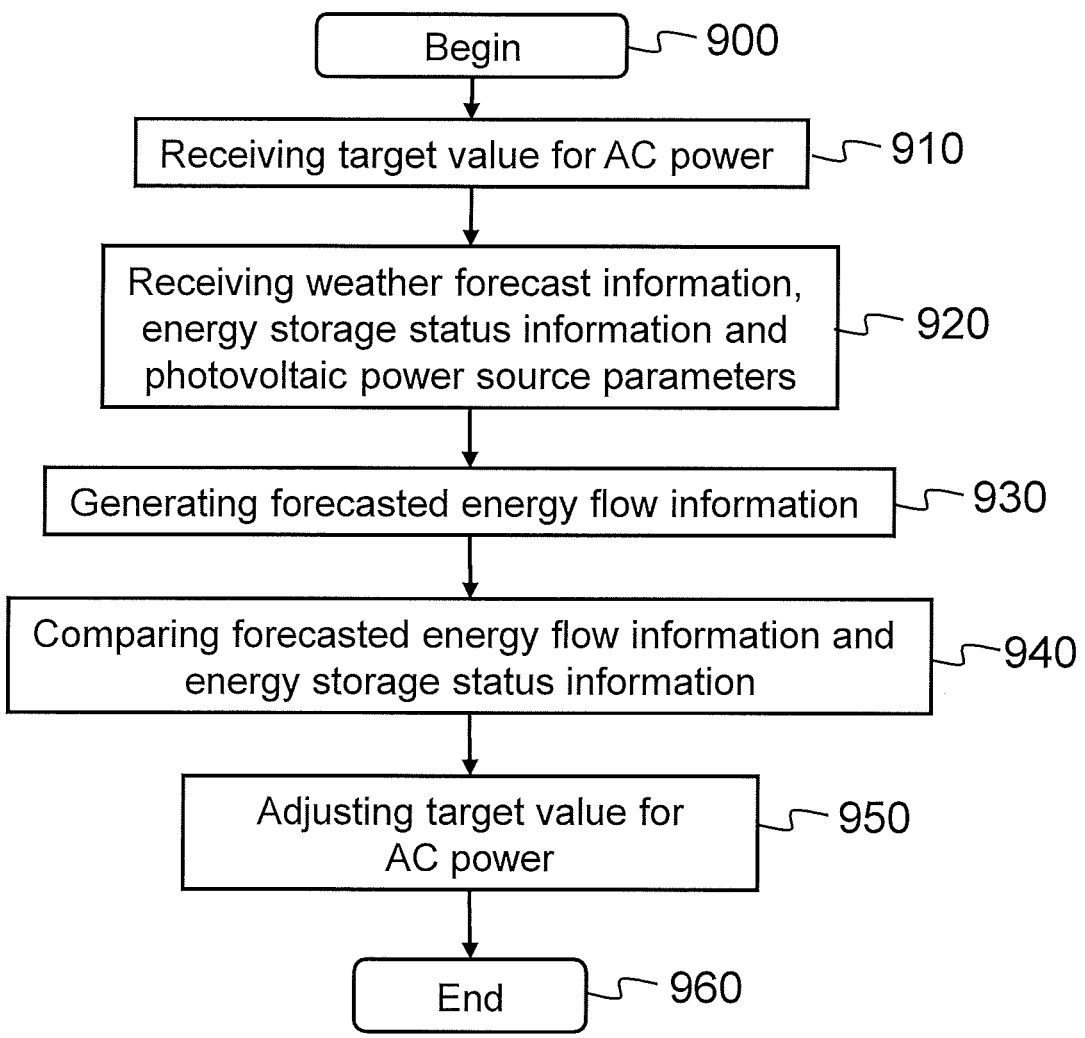

presents an example block diagram of a server apparatus in accordance with an example embodiment;

FIG. 5a shows an illustrative view relating to photovoltaic (PV) firming and time shifting;

FIG. 5b shows an illustrative view relating to Spinning Reserve;

FIG. 5c shows an illustrative view relating to Frequency Regulation;

presents an example block diagram of a remote user device;

FIG. 6 presents an example block diagram of a control apparatus (EMS) in which various embodiments of the invention may be applied;

FIG. 7 presents an example block diagram of a server apparatus in which various embodiments of the invention may be applied;

FIG. 8 presents an example block diagram of a remote computer apparatus in which various embodiments of the invention may be applied; and FIG. 9 shows a flow diagram showing operations in accordance with an example embodiment of the invention.

DETAILED DESCRIPTION

In the following description, like numbers denote like elements.

Figure 1:
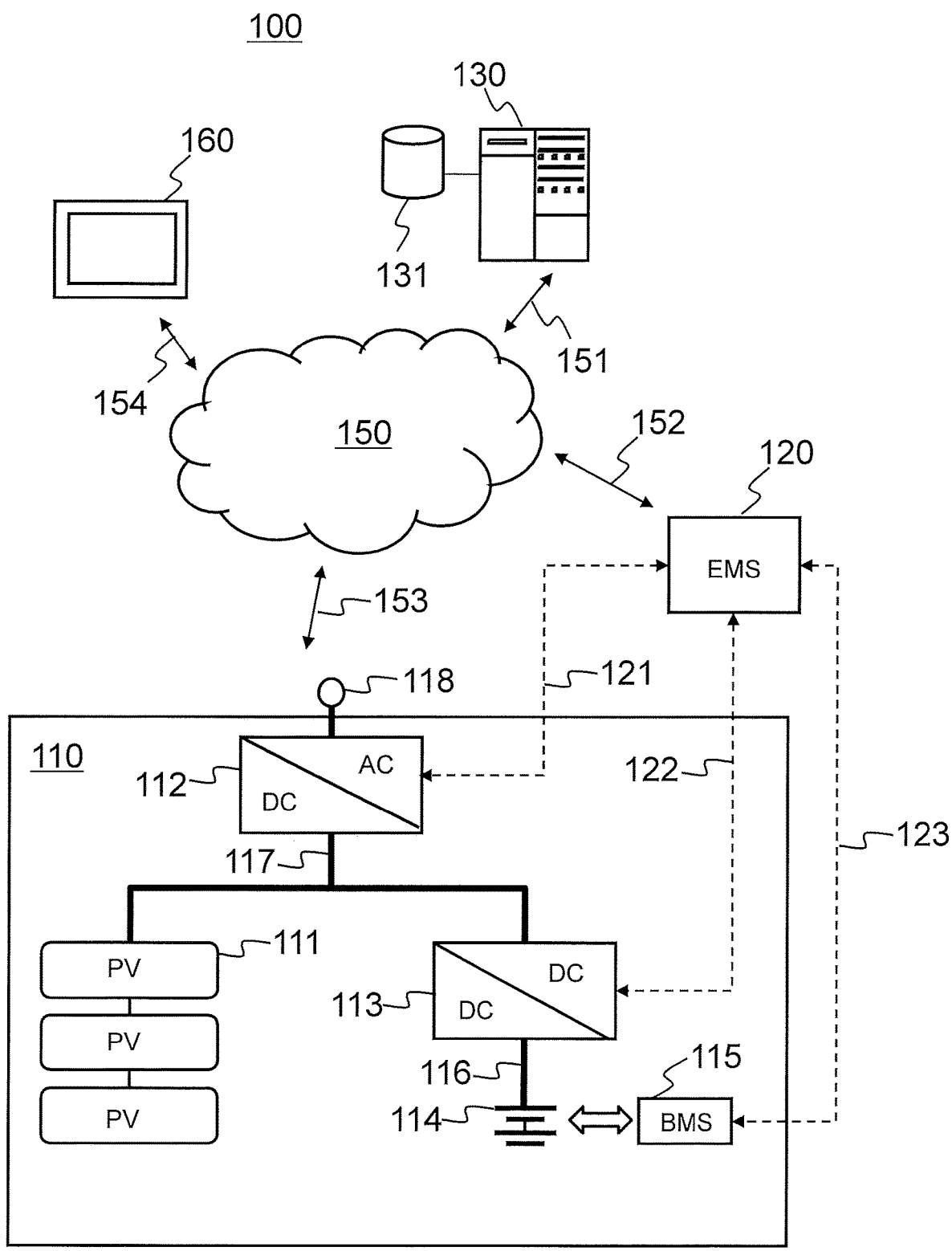
FIG. 1 shows a schematic picture of a system according to an aspect of the disclosed embodiments.

FIG. 1 shows a schematic picture of a system 100 according to an example embodiment.

The power plant system 100 may comprise a power plant subsystem 110 and a controller apparatus (EMS) 120 as separate entities, where the controller apparatus 120 may be remote to the subsystem 110 or the subsystem 110 and the control apparatus 120 may be arranged on the same subsystem 110, 120.

A power plant system 100 comprises a photovoltaic power source 111 to provide photovoltaic DC power to a photovoltaic DC bus 117, an inverter 112 comprising a direct current (DC) power input operationally connected to the photovoltaic DC bus 117 to receive photovoltaic DC power, and an alternating current (AC) power output for supplying AC power to an AC system 118.

The power plant system 100 further comprises a DC-to-DC converter 113 comprising a first direct current (DC) port to be operationally connected to the photovoltaic DC bus 117 in parallel with the photovoltaic power source 111, and an energy storage 114 operationally connected to a second direct current (DC) port of the DC-to-DC converter 113.

The power plant system 100 further comprises an energy storage manager 115 (e.g. battery management system, BMS) operationally connected to the energy storage 114 for monitoring and controlling the energy storage 114.

The power plant system 100 further comprises a controller apparatus 120 coupled to the inverter 112, the DC-to-DC converter 113 and the energy storage manager 115, wherein the controller apparatus 120 is configured to receive target value for the AC power to be supplied for the AC system 118, receive weather forecast information from a service server 130, 131, energy storage status information from the energy storage manager 115 and photovoltaic power source parameters as pre-installed, from the service server 130, 131 or directly from the power source 111. The apparatus 120 is further configured to generate forecasted energy flow information for the photovoltaic power source 111 based on the weather information and the photovoltaic power source parameters; compare the forecasted energy flow information and the energy storage status information; and adjust the target value for the AC power based on the comparison.

The DC-to-DC converter 113 may connect over a battery DC bus 116 to strings of batteries 114 at one side, and connect to the inverter 112 (a photovoltaic inverter, for example) on the inverter's 112 DC bus 117 at the other side, in parallel with the photovoltaic power source 111 (e.g. photovoltaic panel strings) that connect to the same DC bus 117.

In an embodiment, control software within the PV inverter 112 is not required to be aware that any energy storage system (ESS) 114 is present on its DC bus 117. The energy storage system (ESS) or the energy storage 114 illustrated in FIG. 1 may be defined to include all forms of stationary energy storages, including battery storages, such as Li-ion and other electrochemical and flow batteries, for example.

There are no changes necessarily needed to the PV inverter 112 design, installation, control algorithm and communication interface in view what is required to operate a photovoltaic installation without any energy storage 114.

A plurality of communication paths between devices are needed. The controller apparatus 120, such as an energy management system (EMS) controller apparatus, enables photovoltaic (PV) power source 111 and energy storage system (ESS) 114 integration, and provides application control goals by communicating and controlling with each device described in FIG. 1 and further discussed, as follows.

In an embodiment, the (EMS) controller apparatus 120 is configured to communicate with the (PV) inverter 112 over a communication path 121 as it would communicate in a PV installation without an energy storage system (ESS) 114. The (EMS) controller apparatus 120 is configured to send remote stop and start commands to the inverter 112, send AC power curtailment set point to the inverter 112 and obtain inverter 112 status and power readings at both AC side (118) and DC side (117) of the inverter 112.

In an embodiment, the (EMS) controller apparatus 120 is configured to communicate with the energy storage manager (BMS) 115 over a communication path 123. The (EMS) controller apparatus 120 is configured to send commands for BMS 115 to connect/disconnect battery strings 114 to/from the DC bus 116, obtain DC current limits in both charge and discharge directions in real time from the BMS 115, obtain battery 114 status readings such as DC voltages or state of charge from the BMS 115.

In an embodiment, the (EMS) controller apparatus 120 is configured to communicate with the DC-to-DC converter 113 over a communication path 122. The (EMS) controller apparatus 120 is configured to send remote stop and start commands for the DC-to-DC converter 113, send operation mode control commands and power or voltage set points for the DC-to-DC converter 113. The (EMS) controller apparatus 120 is further configured to send maximum DC current limits at the battery DC bus 116 side in both charge and discharge directions for the DC-to-DC converter 113, and obtain DC-to-DC converter 113 status information and power readings at both photovoltaic DC side 117 and battery DC side 116 from the DC-to-DC converter 113.

A plurality of technical effects and advantages may be provided. For example, there may be a need for integrating the energy storage system (ESS) 114 to an already existing photovoltaic (PV) installation 111, and further in an environment where the PV inverter 112 manufacturer, the DC-to-DC converter 113 manufacturer and energy storage/battery 114 manufacturer are from different vendors. It is possible to maximize interoperability and minimize complexity when no direct communications between the PV inverter 112, the DC-to-DC converter 113 and the energy storage manager (BMS) 115 is required.

In an embodiment, the (EMS) controller apparatus 120 may comprise means for generating, processing and transceiving power plant system related data through a communication interface, for example. The apparatus 120 is capable of downloading and locally executing software program code. The software program code may be a client application of a service whose possible server application is running on a server apparatus 130, 131 of the system 100. Any of the sub-system 110 devices 111-118 may comprise a capturing device, such a sensor device, for providing power plant related signals. The sensor device may comprise a sensor, a microphone or a camera, for example. The camera may also be used to provide video data and a microphone may be used for providing audio data, for example.

The apparatus 120 is configured to be connectable to a public network 150, such as Internet, over connection 152. The connection 152 may be arranged directly via local connection or via a wireless communication network over a wireless connection, for example. The wireless connection may comprise a mobile cellular network, a satellite network or a wireless local area network (WLAN), for example. The wireless communication network may be connected to a public data communication network 150, for example the Internet, over a data connection. The apparatus 120 may be configured to be connectable to the public data communication network 150, for example the Internet, directly over a data connection that may comprise a fixed or wireless mobile broadband access.

The sub-system 110, or any of the devices within the sub-system 110 may be configured to be connectable to a public network 150, such as Internet, over connection 153.

In an embodiment, any of the connection paths 121-123 may be arranged as direct connections without routing via the network 150, or arranged to be routed via the network 150. The connection paths 121-123 are configured to provide communication and control between the controller apparatus 120 and the sub-system 110 devices 111-118.

The apparatus 120 and its client application may allow the apparatus 120 to log into a power plant data service run on a server 130, for example.

Real-time interaction may be provided between the apparatus 120, the sub-system 110 and the server 130 to collaborate for power plant system data over a network 150. Real-time interaction may also be provided between the apparatus 120 and a remote user device 160 to collaborate for data over a network 150.

The user of the apparatus 120 or the remote user device 160 may need to be logged in with user credentials to a chosen service of the network server 130.

In an embodiment, a device 111-118 of the sub-system 110 may comprise a sensor device configured to be comprised by or connectable to the apparatus 120 over a local connection 121-123 or to a server 130 over the network 150. The local connection may comprise a wired connection or a wireless connection. The wireless connection may comprise acoustic connection, Bluetooth™, Radio Frequency Identification (RF-ID), ZigBee, or wireless local area network (WLAN), for example. Near field communication (NFC) may be used for sensor device identification between the sensor device and any other device, for example. Data provided by at least one sensor device may be used as an input to the control algorithm and software within the (EMS) control apparatus 120. The input may be used for providing, for example, environmental data, such as temperature information, brightness information, HVAC information, and smoke detection information, for example.

A sensor device arranged to any device 111-118 of the sub-system 110 may also be connected directly to the public network 150, such as Internet, via direct local connection or via a wireless cellular network connection.

In an embodiment, the system 100 may comprise a server apparatus 130, which comprises a storage device 131 for storing service data, service metrics and subscriber information, over data connection 151. The service data may comprise configuration data; account creation data; sensor data; sensor ID's; control data, history data, user input data; real-time collaboration data; predefined settings; and attribute data, for example.

In an embodiment, a proprietary application in the apparatus 120 may be a client application of a service whose server application is running on the server apparatus 130 of the system 100.

The proprietary application of the apparatus 120 may receive input data from the sub-system 110 and provide the output data. The input data may comprise data captured by a sensor device arranged to any device 111-118 of the sub-system 110 or data generated directly by any device 111-118.

In an embodiment, configuration information or application download information for any apparatus may be automatically downloaded and configured by the server 130. Thus, the user of the devices may not need to do any initialization or configuration for the service. The system server 130 may also take care of account creation process for the service, such as sensors, devices, apparatuses and users.

In an embodiment, the association of the devices can be one-time or stored persistently on any of the devices or the server 130.

In an embodiment, authentication of a device 111-118 or apparatus 120 on a system server 130 may utilize hardware or SIM credentials, such as International Mobile Equipment Identity (IMEI) or International Mobile Subscriber Identity (IMSI). Any device 111-118 or apparatus 120 may transmit authentication information comprising IMEI and/or IMSI, for example, to the system server 130. The system server 130 authenticates the device by comparing the received authentication information to authentication information of registered users stored at the system server database 131, for example. Such authentication information may be used for pairing the devices and/or apparatuses to generate association between them for a power plant related data connection.

In an embodiment, a service web application may be used for configuration of a system. The service web application may be run on any user device, admin device, or a remote control device 160, such as a personal computer connected to a public data network, such as Internet 150, for example. The control apparatus 160 may also be connected locally to the apparatus 120 over a local connection and utilize the network connections of the apparatus 120 for configuration purposes. The service web application of the control apparatus may provide searching/adding instruments, determining attributes, device setup and configuration, for example. The service web application of the control apparatus 160 may be a general configuration tool for tasks being too complex to be performed on the user interface of the apparatus 120, for example.

In an embodiment, a remote control apparatus 160 may be authenticated and configuration data sent from the control apparatus 160 to the system server 130, 131 wherein configuration settings may be modified based on the received data. In an embodiment, the modified settings may then be sent to the apparatus 120 over the network 150 and the local connection or the wireless operator. The modified settings may also be sent to external devices correspondingly, through the apparatus 120 or directly over the network 150, for example.

In an embodiment, any sensor device may be wireless or wired.

Figure 2:
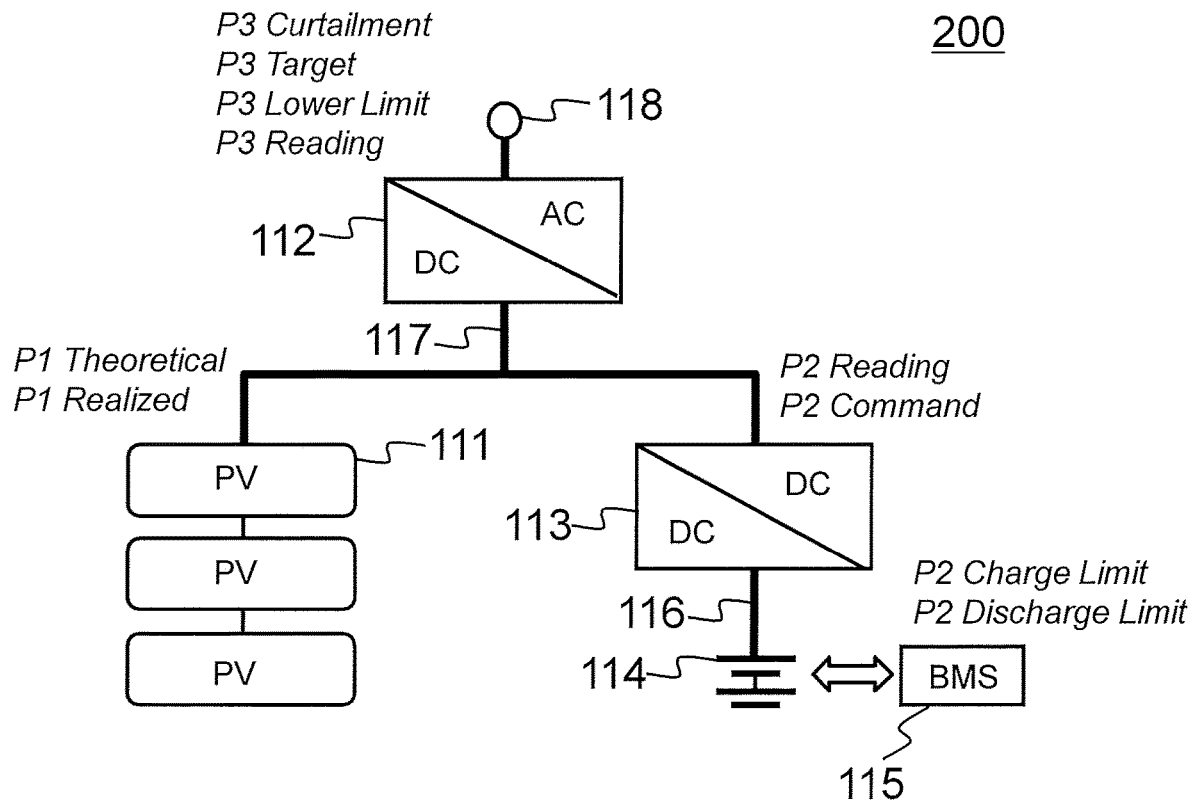
FIG. 2 shows a schematic view on device power commands and readings within a system of FIG. 1 according to an aspect of the disclosed embodiments.

FIG. 2 shows a schematic view 200 on device power commands and readings within a system 100 of FIG. 1 according to an aspect of the disclosed embodiments.

To simplify the view, only some of the devices 111-118 are illustrated in view of FIG. 1 structure.

In an embodiment, a photovoltaic (PV) power source 111 is DC-Coupled with an energy storage 114 via a DC-to-DC converter 113.

The DC-to-DC converter 113 may be controlled for integrating the energy storage system 114 to the photovoltaic (PV) power source system 111 at DC side (DC-coupled) of the (PV) inverter 112.

The DC-coupled design as illustrated in various embodiments enables at least following photovoltaic (PV) power source system and energy storage applications:

1) Harvest clipped photovoltaic (PV) energy stored into an energy storage (e.g. a battery system)
2) Achieve photovoltaic (PV) firming and photovoltaic (PV) power production time shifting
3) Achieve fast and accurate power dispatches needed for applications such as frequency regulation The DC-coupled approach has significant advantages over AC-coupled approach in terms of equipment cost savings, for example.

In an embodiment, a control algorithm is configured to be arranged at the control apparatus 120 (see FIG. 1) of the system to control the system. FIG. 2 shows some key signals exchanged between the control apparatus 120 and the devices 111-118 to enable the control. Typically, the (PV) power source system 111 is connected to the system and the (PV) inverter 112 output power to the AC system 118 is controlled when the (PV) power source system 111 generates power.

The key signals/commands/parameters are shortly discussed as follows:

"P3 Target"

"P3 Target" is the target of the PV inverter 112 AC power output 118 to the grid determined by the control apparatus (EMS). It is typically always positive or zero. It should be below "P3 Curtailment" and is determined by many factors such as application control goals, restrictions imposed by device rated powers or feeder limits, economical values determined by market prices, etc. Details of how "P3 Target" is calculated is discussed later relating to different embodiments.

"P3 Curtailment"

"P3 Curtailment" is calculated by the control apparatus (EMS) and sent to the PV inverter 112 to ensure the actual PV inverter 112 AC power output 118 never exceeds this curtailment value. The "P3 Curtailment" should be sufficiently higher than "P3 Target". With the right sizing of the PV inverter 112, the DC-to-DC converter 113 and the energy storage such as a battery 114, the PV inverter 112 should never be curtailed. In some embodiments disclosed, the rated power of PV inverter 112 is used as "P3 Curtailment" in control calculation.

"P3 Readinq"

"P3 Reading" is the actual PV inverter 112 AC power reading normally obtainable from the PV inverter 112. It is typically always positive or zero.

"P2 Command"

"P2 Command" is the DC-to-DC converter 113 energy storage (e.g. battery) power set point commanded by the control apparatus (EMS) for charging or discharging the energy storage 114 (e.g. battery). Positive value means charging the energy storage 114 (e.g. battery), and negative value means discharging the energy storage (e.g. battery). Its determination is the focus of the control section.

"P2 Reading"

"P2 Reading" is the actual DC-to-DC converter 113 energy storage 114 (e.g. battery) power reading obtained from the DC-to-DC converter 113. Positive value means the energy storage 114 (e.g. battery) is charging and negative value means the energy storage 114 (e.g. battery) is discharging. This value may be used as reference only for verification purpose. It may not be directly used as input data to the control algorithm.

"P1 Theoretical"

"P1 Theoretical" is a theoretical photovoltaic (PV) power output capability. It is affected by weather and PV panel conditions, for example. Some portion of P1 energy cannot be realized due to the PV inverter 112 curtailment, equipment inefficiency, and timing of controls and the control algorithm. This value can be estimated and used to verify efficiency of the overall system control algorithm.

"P1 Realized"

"P1 Realized" is the total photovoltaic (PV) output that is either released to the grid via AC output 118 or charged into the energy storage 114, such as the battery. "P1 Realized" can be calculated by the following formula:

$$P1 = P2\ \text{Reading} + P3\ \text{Reading}$$

The key goal of controlling the overall system including the photovoltaic (PV) power source 111 and the energy storage 114 (e.g. battery system) is to make "P1 Realized" as close to "P1 Theoretical" as possible with existing hardware constraints and economical optimization. "P1 Realized" may be used as reference value only for verification purpose. It may not be directly used as input data to the control algorithm.

In an embodiment, for the control algorithm of the control apparatus (EMS) to run appropriately, it is required that the DC-to-DC converter 113 is configured to be run in constant power mode. That is, the DC-to-DC converter 113 follows the PV DC bus 117 voltage set by the photovoltaic (PV) inverter 112. "P2 command" issued by the control apparatus (EMS) causes the DC-to-DC converter 113 to adjust its DC power to meet the power set point value. A PID-based close-loop control may be used for the DC-to-DC converter 113 software to meet the power demand, such as within 1% of control error and within 100 milliseconds of response time.

In an embodiment, the photovoltaic (PV) power source 111 may be temporarily disconnected from the DC bus 117. In such case the photovoltaic (PV) inverter 112 may be configured to provide output power to grid 118 and controlled as follows.

First, the (EMS) control apparatus 120 is configured to set the DC-to-DC converter 113 in constant voltage mode at a fixed voltage within the photovoltaic (PV) inverter's 112 operational DC voltage range.

Second, the (EMS) control apparatus 120 is configured to set the photovoltaic (PV) inverter's 112 curtailment power "P3 Curtailment" to the desired power value.

Figure 3:
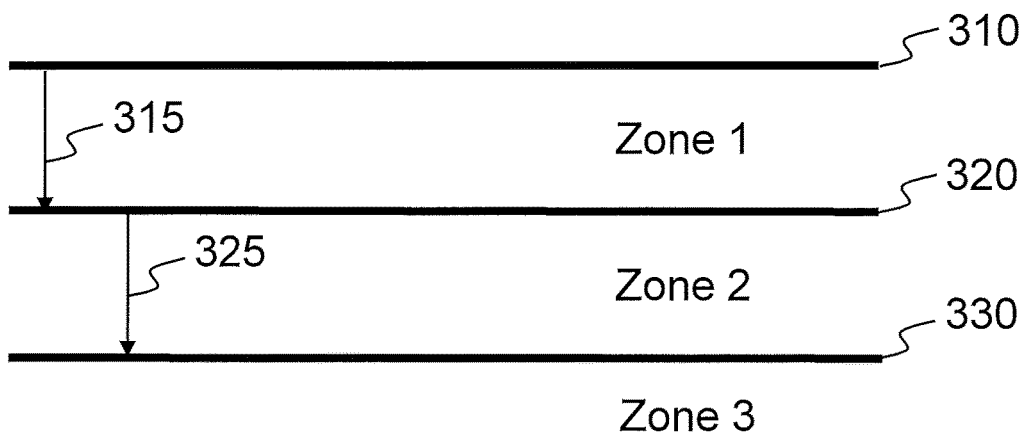
FIG. 3 shows a schematic picture of DC-to-DC converter power control zones in accordance with an example embodiment.

FIG. 3 shows a schematic picture of the DC-to-DC converter 113 power control zones (Zone 1-3) in accordance with an example embodiment.

Reference is made to FIGS. 1-2 and related elements. The battery power command "P2 Command" is determined by comparing the PV inverter 112 power output reading "P3 Reading" and PV inverter 112 power output target "P3 Target".

As shown in FIG. 3, the AC power output 118 value may be divided into three zones, Zone 1-3:

Zone 1 is defined to be between "P3 Curtailment" 310 and "P3 Target" 320. When "P3 Reading" output falls within this zone, "P2 Command" should be increased to increase energy storage (e.g. battery) charge power to harvest more PV energy into the storage or decrease energy storage (e.g. battery) discharge power to reduce energy storage (e.g. battery) power output into grid via output 118.

Zone 2 is defined to be between "P3 Target" 320 and "P3 Reading Lower Limit" 330. When "P3 Reading" is in this zone, energy storage (e.g. battery) is charging or discharging at the right power level so the current "P2 Command" should be maintained.

Zone 3 is defined to be below "P3 Reading Lower Limit" 330. When "P3 Reading" is in this zone, energy storage (e.g. battery) is over charging or under discharging so the "P2 Command" should be decreased.

As illustrated, "P3 Target" 320 is lower than "P3 Curtailment Limit" 310 by a first margin 315 that should be substantially large enough to reduce the chance that PV inverter 112 actually curtails its power output 118. By reducing the curtailment, energy loss is also reduced. "P3 Reading Lower Limit" is lower than "P3 Target" a second margin 325 that should be at least twice as large as the DC-to-DC converter 113 power control error.

FIG. 4 shows a flow diagram 400 of an exemplary method for a control flow of the DC-to-DC converter 113 in accordance with an example embodiment. Reference is also made to FIGS. 1-3 and related elements.

In an embodiment, the control flow of DC-to-DC converter comprises "P2 Command" calculation by the control apparatus (EMS) 120 and the associated control algorithm, for example.

In an embodiment, $\Delta T$ (DELTA T) is the time interval between each DC-to-DC converter 113 power control iteration. Since each control iteration may result in changing the DC current, the DC-to-DC converter 113 power control intervals should be much larger than the PV inverter's 112 Maximum Power Point Tracking (MPPT) control interval so that the DC-to-DC converter 113 control will not interfere with PV inverter's 112 Maximum Power Point Tracking (MPPT) operation. For example, if the PV inverter 112 conducts Maximum Power Point Tracking (MPPT) adjustment every 0.5 seconds, then the DC-to-DC converter 113 control interval could be 2 seconds.

In an embodiment, $\Delta P$ (DELTA P) is the power increment of DC-to-DC converter 113 when the energy storage (e.g. battery) charge power should be increased. It may be a fixed value and should be less than half of the second margin 325 (see FIG. 3).

In step 410 the control method at the control apparatus (EMS) 120 is started. In step 420, "P3 Reading" is obtained from the PV inverter 112. In step 430, "P3 Reading" is compared to "P3 Lower Limit". If "P3 Reading" is lower, then the control flow moves to step 440, and if higher, then the control flow moves to step 450. In step 440, "P2 Command" is decreased by a power control value determined by ("P3 Target"–"P3 Reading"). In step 441, it is compared if "P2 Command" is less than zero and further if "P2 Command" is also less than the negative value of the "Max Battery Discharge Power Limit". If both comparisons in step 441 do not result positive, then the control flow moves to step 460, otherwise the control flow moves to step 442. In step 442, "P2 Command" is set as the negative value of the "Max Battery Discharge Power Limit" before moving to step 460.

In step 450, "P3 Reading" is compared to "P3 Target". If "P3 Reading" is smaller than "P3 Target", then the control flow moves to step 470. If "P3 Reading" is greater than "P3 Target", then the control flow moves to step 451. In step 451, "P2 Command" is increased by $\Delta P$ (DELTA P) before moving to step 452. In step 452, it is compared if "P2 Command" is greater than the "Max Battery Charge Power Limit". If not, then the control flow moves to step 460, and if greater the control flow moves to step 453. In step 453, "P2 Command" is set as the negative value of the "Max Battery Discharge Power Limit" before moving to step 460.

In an embodiment, "Max Battery Discharge Power Limit" and "Max Battery Charge Power Limit" are for battery protection purposes. They are continuously evaluated by the control software, such as the control SW of the control (EMS) apparatus 120, based on battery readings and measurements (e.g. state of charge (SOC), voltages, temperatures, number of DC-connected battery strings, etc.), and then sent to the DC-to-DC converter 113 so that those operation limits are nor violated and batteries 114 are thus protected.

In step 460, an updated "P2 Command" is transmitted to the DC-to-DC Converter 113. In step 470, a time period of ΔT (DELTA T) is waited before returning back to step 420.

FIGS. 5a-5c describe how to conduct some alternative power applications using the combination of the (PV) inverter 112 and the DC-to-DC converter 113 when the photovoltaic (PV) power source 111 is connected to the DC bus 117 and generating power.

When photovoltaic (PV) power source 111 (such as PV panels) is disconnected from the DC bus 117, the control is more simple. Then the (EMS) control apparatus 120 sets the DC-to-DC converter 113 in constant voltage mode at a fixed voltage within PV inverter's 112 operational DC voltage range, and then control PV inverter's 112 curtailment to the desired power value the application logic desires.

FIG. 5a shows an illustrative view 510 relating to photovoltaic (PV) firming and time shifting. Reference is also made to FIGS. 1-4 and related elements.

In an embodiment, the control algorithm run by the control apparatus (EMS) 120 may be configured to be used for the system 100 PV Firming and Time Shifting application.

As shown in FIG. 5a, such application enables the AC power output to grid as predicable, uniform shape with controlled ramp. The system can also release steady power into the grid at night when no photovoltaic (PV) power can be produced.

The "P3 Target" is calculated and adjusted periodically by the control apparatus (EMS) 120 based on the following steps:

Step 1: Using contract obligation to determine the initial "P3 Target". Using this initial value to calculate Planned Energy output into the grid.

Step 2: The difference between Forecasted PV Energy Production and Planned Energy output determines Forecasted Energy Flow to or from battery for the next period.

Step 3: Comparing the current battery position and Forecasted Energy Flow to determine if battery has enough available capacity to accommodate the Forecasted Energy Flow.

Step 4a: If Forecasted Energy Flow (Step 3) is positive and storage has not enough available capacity to accommodate Forecasted Energy Flow into the battery, then move "P3 Target" up, repeat steps 2 and 4a until the battery can accommodate Forecasted Energy Flow, or as much as possible until other hard limits are reached. The extra energy flow that cannot be accommodated will be clipped by the PV Inverter 112.

Step 4b: If Forecasted Energy Flow (Step 3) is negative and storage has no enough charge to supply Forecasted Energy Flow out of battery, then move "P3 Target" down, repeat steps 2 and 4b until battery can satisfy Forecasted Energy Flow or as much as possible until other hard limits are reached.

For purposes of illustration simplicity, FIG. 5a shows constant "P3 Target" throughout the timescale (e.g. day). In reality, depending on the market obligation and project specifics, "P3 Target" can be adjusted more frequently (e.g. hourly). The more often "P3 Target" can be adjusted, the less likely battery become over charged or over discharged, the more efficient the control algorithm, and the closer "P3 Reading" follows "P3 Target".

FIG. 5b shows an illustrative view 520 relating to Spinning Reserve. Reference is also made to FIGS. 1-5a and related elements.

In an embodiment, the control algorithm run by the control apparatus (EMS) 120 may be configured to be used for the system 100 Spinning Reserve application.

In an embodiment, the Spinning Reserve application may be derived from PV firming application described above. As shown in FIG. 5b, maximum AC power output of the system is the rated power of the PV inverters. The maximum spinning reserve the system can provide is the difference between "P3 Target" and "PV inverter rated power".

To increase the size of spinning reserve, "P3 Target" should be decreased. Dropping "P3 Target" results in more energy needs to be stored in battery if spinning demand is not called, hence requiring increasing the size of the battery. These additional requirements should be carefully considered in equipment sizing during design stage of the system.

The bid-in "Spinning Reserve" value is fixed for the calculation period, and the "P3 Target" value is calculated by the control apparatus 120 (EMS) using the following steps:

Step 1: Initial "P3 Target" value is calculated as: "PV Inverter Rated Power"-"Spinning Reserve".

Step 2: Calculate Planned Energy output into the grid.

Step 3: The different between Forecasted PV Energy Production and Planned Energy output determines Forecasted Energy Flow to or from battery for the next period.

Step 4: Comparing the current battery position and Forecasted Energy Flow determines if battery has enough available capacity to accommodate the Forecasted Energy Flow.

Step 5a: If Forecasted Energy Flow (Step 4) is positive and storage has no enough available free capacity to accommodate Forecasted Energy Flow into battery, then extra energy flow that cannot be accommodated will be clipped by the PV Inverter 112. This should rarely happen if the equipment is sized correctly and PV forecast is reasonably accurate.

Step 5b: If Forecasted Energy Flow (Step 4) is negative, we need to make sure storage has enough energy left at the end of the period to put out power at the level of "P3 Target"+"Spinning Reserve", if Spinning Reserve is called upon. If such requirement cannot be met, decrease "P3 Target" value, repeat step 2, 3, and 5b until such condition is met.

In an embodiment, when the spinning reserve service is called upon, the control apparatus (EMS) 120 immediately changes "P3 Target" to be original value of "P3 Target"+ "Spinning Reserve".

For purposes of illustration simplicity, FIG. 5b shows constant "P3 Target" and "Spinning Reserve" throughout the day. In reality, depending on the market obligation and project specifics, "P3 Target" can be adjusted more frequently (e.g. hourly). The more often "P3 Target" can be adjusted, the less likely battery become over charged or over discharged, the more efficient the control algorithm. Additional flexibility and optimization can be achieved if the "Spinning Reserve" value bid into the market can be changed more frequently.

FIG. 5c shows an illustrative view 530 relating to Frequency Regulation. Reference is also made to FIGS. 1-5b and related elements.

In an embodiment, the control algorithm run by the control apparatus (EMS) 120 may be configured to be used for the system 100 Frequency Regulation application.

As shown in FIG. 5c, Frequency Regulation is used to illustrate how "P3 Target" can be controlled to fulfil frequency regulation application task. The maximum AC power output of system is the rated power of the PV inverter(s). It is the upper bound of Maximum "P3 Target". Regulation "Power Base Point" can be calculated as:

Maximum "P3 Target"–"Regulation Range"/2

The "Power Base Point" is calculated and adjusted periodically by the control apparatus (EMS) 120 based on the following steps:

Step 1: Start with initial "Power Base Point" as:

PV Inverter Rated Power–"Regulation Range"/2

Step 2: Use "Power Base Point" to Calculated Planned Energy Output assuming that real regulation power distributes around the base point and is statistically symmetric.

Step 3: The difference between Forecasted PV Energy Production and Planned Energy Output determines Forecasted Energy Flow to or from battery for the next period.

Step 4: Comparing the current battery position and Forecasted Energy Flow determines if battery has enough available free capacity to accommodate the Forecasted Energy Flow.

Step 5a: If Forecasted Energy Flow (Step 4) is positive and storage has not enough available free capacity to accommodate Forecasted Energy Flow into battery, then move "Power Base Point" up, repeat steps 2, 3 and 5a until battery can accommodate Forecasted Energy Flow, or as much as possible until other hard limits are reached.

Step 5b: If Forecasted Energy Flow is negative and storage has no enough charge to supply Forecasted Energy Flow out of battery, then move "Power Base Point" down, repeat steps 2, 3 and 5.b until battery can satisfy Forecasted Energy Flow or as much as possible until other hard limits are reached.

FIG. 6 presents an example block diagram of a control apparatus (EMS) 120 in which various embodiments of the invention may be applied. The apparatus 120 may be a user equipment (UE), user device or apparatus, such as a remote computer system.

The general structure of the apparatus 120 comprises a user interface 640, a communication interface 650, a processor 610, and a memory 620 coupled to the processor 610. The apparatus 120 further comprises software 630 stored in the memory 620 and operable to be loaded into and executed in the processor 610. The software 630 may comprise one or more software modules and can be in the form of a computer program product.

The apparatus 120 may also optionally comprise a satellite positioning device (GPS) 670, a capturing device 660 for capturing local activity data and/or current environmental data. The apparatus 120 may further comprise a user interface controller 280.

The processor 610 may be, e.g., a central processing unit (CPU), a microprocessor, a digital signal processor (DSP), a graphics processing unit, or the like. FIG. 6 shows one processor 610, but the apparatus 120 may comprise a plurality of processors.

The memory 620 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The apparatus 120 may comprise a plurality of memories. The memory 620 may be constructed as a part of the apparatus 120 or it may be inserted into a slot, port, or the like of the apparatus 120 by a user. The memory 620 may serve the sole purpose of storing data, or it may be constructed as a part of an apparatus serving other purposes, such as processing data. A proprietary data application (client control application) 631, control system data and environmental data may be stored to the memory 620.

The user interface controller 680 may comprise circuitry for receiving input from a user of the apparatus 120, e.g., via a keyboard, graphical user interface shown on the display of the user interfaces 640 of the apparatus 120, speech recognition circuitry, or an accessory device, such as a headset, and for providing output to the user via, e.g., a graphical user interface or a loudspeaker.

The satellite positioning device 670 is configured to provide location information. Such information may comprise, for example, position coordinates, speed, direction of movement, time (GPS time) and altitude information.

The communication interface module 650 implements at least part of data transmission. The communication interface module 650 may comprise, e.g., a wireless or a wired interface module. The wireless interface may comprise such as a WLAN, Bluetooth, infrared (IR), radio frequency identification (RF ID), GSM/GPRS, CDMA, WCDMA, LTE (Long Term Evolution) or 5G radio module. The wired interface may comprise such as universal serial bus (USB) or National Marine Electronics Association (NMEA) 0183/2000 standard for example. The communication interface module 650 may be integrated into the apparatus 120, or into an adapter, card or the like that may be inserted into a suitable slot or port of the apparatus 120. The communication interface module 650 may support one radio interface technology or a plurality of technologies. The apparatus 120 may comprise a plurality of communication interface modules 650.

A skilled person appreciates that in addition to the elements shown in FIG. 6, the apparatus 120 may comprise other elements, such as microphones, extra displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like. Additionally, the apparatus 120 may comprise a disposable or rechargeable battery (not shown) for powering when external power if external power supply is not available.

In an embodiment, the apparatus 120 comprises speech recognition means. Using these means, a pre-defined phrase may be recognized from the speech and translated into control information for the apparatus 120, for example.

The satellite positioning device 670 and the capturing device 660 may be configured to be comprised by the apparatus 120 or connected as separate devices to the apparatus 120. In case the satellite positioning device 670 and the capturing device 660 are comprised in the apparatus 120 they may be connected to the apparatus 120 using an internal bus of the apparatus 120. In case the satellite positioning device 670 and the capturing device 660 are external devices connected to the apparatus 120 they may be connected to the apparatus 120 using communication interface 650 of the apparatus 120 or using the internal bus.

FIG. 7 presents an example block diagram of a server apparatus 130 in which various embodiments of the invention may be applied.

The general structure of the server apparatus 130 comprises a processor 710, and a memory 720 coupled to the processor 710. The server apparatus 130 further comprises software 730 stored in the memory 720 and operable to be loaded into and executed in the processor 710. The software 730 may comprise one or more software modules, such as service application 731 and can be in the form of a computer program product.

The processor 710 may be, e.g., a central processing unit (CPU), a microprocessor, a digital signal processor (DSP), a graphics processing unit, or the like. FIG. 7 shows one processor 710, but the server apparatus 130 may comprise a plurality of processors.

The memory 720 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The server apparatus 130 may comprise a plurality of memories. The memory 720 may be constructed as a part of the server apparatus 130 or it may be inserted into a slot, port, or the like of the server apparatus 130 by a user. The memory 720 may serve the sole purpose of storing data, or it may be constructed as a part of an apparatus serving other purposes, such as processing data.

The communication interface module 750 implements at least part of radio transmission. The communication interface module 750 may comprise, e.g., a wireless or a wired interface module. The wireless interface may comprise such as a WLAN, Bluetooth, infrared (IR), radio frequency identification (RF ID), GSM/GPRS, CDMA, WCDMA, LTE (Long Term Evolution) or 5G radio module. The communication interface module 750 may be integrated into the server apparatus 130, or into an adapter, card or the like that may be inserted into a suitable slot or port of the server apparatus 130. The communication interface module 750 may support one radio interface technology or a plurality of technologies. Captured control system data associated with environmental data of the apparatus 120 or sub-system 110 may be received by the server apparatus 130 using the communication interface 750.

The e-mail server process 760, which may receive e-mail messages sent from control apparatuses 120 and remote computer apparatuses 160 via the network 150. The server 760 may comprise a content analyzer module 761, which checks if the content of the received message meets the criteria that are set for new activity data item of the service. The content analyzer module 761 may for example check whether the e-mail message contains a valid activity data item to be used. The valid data item received by the e-mail server is then sent to an application server 740, which provides application services e.g. relating to the user accounts stored in a user database 770 and content of the content management service. Content provided by the service system 100 is stored in a content database 780.

A skilled person appreciates that in addition to the elements shown in FIG. 7, the server apparatus 130 may comprise other elements, such as microphones, displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like.

FIG. 8 presents an example block diagram of a remote computer apparatus 160 in which various embodiments of the invention may be applied. The computer apparatus 160 may be a user equipment (UE), user device or apparatus, such as a mobile terminal, a smart phone, a laptop computer, a desktop computer or other communication device.

The general structure of the computer apparatus 160 comprises a user interface 840, a communication interface 850, a processor 810, and a memory 820 coupled to the processor 810. The computer apparatus 160 further comprises software 830 stored in the memory 820 and operable to be loaded into and executed in the processor 810. The software 830 may comprise one or more software modules, such as remote client software application 831, and can be in the form of a computer program product. The computer apparatus 160 may further comprise a user interface controller 860.

The processor 810 may be, e.g., a central processing unit (CPU), a microprocessor, a digital signal processor (DSP), a graphics processing unit, or the like. FIG. 8 shows one processor 810, but the computer apparatus 160 may comprise a plurality of processors.

The memory 820 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The computer apparatus 160 may comprise a plurality of memories. The memory 820 may be constructed as a part of the computer apparatus 160 or it may be inserted into a slot, port, or the like of the computer apparatus 160 by a user. The memory 820 may serve the sole purpose of storing data, or it may be constructed as a part of an apparatus serving other purposes, such as processing data.

The user interface controller 860 may comprise circuitry for receiving input from a user of the computer apparatus 160, e.g., via a keyboard, graphical user interface shown on the display of the user interfaces 840 of the computer apparatus 160, speech recognition circuitry, or an accessory device, such as a headset, and for providing output to the user via, e.g., a graphical user interface or a loudspeaker.

The communication interface module 850 implements at least part of radio transmission. The communication interface module 850 may comprise, e.g., a wireless or a wired interface module. The wireless interface may comprise such as a WLAN, Bluetooth, infrared (IR), radio frequency identification (RF ID), GSM/GPRS, CDMA, WCDMA, LTE (Long Term Evolution) radio module or 5G. The wired interface may comprise such as universal serial bus (USB) or National Marine Electronics Association (NMEA) 0183/2000 standard for example. The communication interface module 850 may be integrated into the remote computer apparatus 160, or into an adapter, card or the like that may be inserted into a suitable slot or port of the remote computer apparatus 160. The communication interface module 850 may support one radio interface technology or a plurality of technologies. The computer apparatus 160 may comprise a plurality of communication interface modules 850.

A skilled person appreciates that in addition to the elements shown in FIG. 8, the computer apparatus 160 may comprise other elements, such as microphones, extra displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like. Additionally, the computer apparatus 160 may comprise a disposable or rechargeable battery (not shown) for powering when external power if external power supply is not available.

FIG. 9 shows a flow diagram showing operations in accordance with an example embodiment of the invention. In step 900, the method for controlling a power plant system comprising a photovoltaic power source, an inverter, a DC-to-DC converter, an energy storage and an energy storage manager, is started. In step 910, target value is received for AC power to be supplied by the inverter. In step 920, weather forecast information, energy storage status information and photovoltaic power source parameters are received. In step 930, forecasted energy flow information is generated for the photovoltaic power source based on the weather information and the photovoltaic power source parameters. In step 940, the forecasted energy flow information and the energy storage status information are compared. In step 950, the target value for the AC power is adjusted based on the comparison. The method is ended in step 660.

In another aspect, a computer program embodied on a computer readable non-transitory medium comprising computer executable program code, which when executed by at least one processor of a device, causes the device to perform computer implemented method steps as disclosed in different embodiments.

Without in any way limiting the scope, interpretation, or application of the claims appearing below, a technical effect of one or more of the example embodiments disclosed herein is an improved system for a power plant control.

A technical effect of one or more of the example embodiments disclosed herein is that reliability of the control system is improved.

A technical effect of one or more of the example embodiments disclosed herein is that control system parameter estimation is improved.

A further technical effect of one or more of the example embodiments disclosed herein is that accuracy of control data is improved.

Another technical effect of one or more of the example embodiments disclosed herein is that wider variety of devices and manufacturers may be used.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the foregoing describes example embodiments of the invention, these descriptions should not be viewed in a limiting sense. Rather, there are several variations and modifications that may be made without departing from the scope of the present invention as defined in the appended claims.

The invention claimed is:

1. A computer implemented method for controlling a power plant system, the power plant system including a photovoltaic power source configured to provide photovoltaic DC power to a photovoltaic DC bus, the photovoltaic power source including an inverter including a direct current (DC) power input operationally connected to the photovoltaic DC bus to receive photovoltaic DC power, and an alternating current (AC) power output for supplying AC power to an AC system, a DC-to-DC converter including a first direct current (DC) port to be operationally connected to the photovoltaic DC bus in parallel with the photovoltaic power source, an energy storage and an energy storage manager operationally connected to a second direct current (DC) port of the DC-to-DC converter, the method for controlling the power plant system comprising:
receiving a target value for the AC power to be supplied by the inverter;
receiving weather forecast information, energy storage status information and photovoltaic power source parameters;
generating forecasted energy flow information for the photovoltaic power source based on the weather information and the photovoltaic power source parameters;
comparing the forecasted energy flow information and the energy storage status information; and
adjusting the target value for the AC power based on the comparison.

2. The method of claim 1, further comprising:
receiving inverter power output readings at both AC side and DC side from the inverter;
determining a DC-to-DC converter power set point based on comparison of the inverter power output reading at AC side and the target value for the AC power; and
transmitting the DC-to-DC converter power set point to the DC-to-DC converter for controlling charging or discharging the energy storage at the DC-to-DC converter power set point.

3. The method of claim 2, further comprising:
defining AC power curtailment set point for the inverter as a maximum AC power output, wherein the inverter power output reading at AC side is configured to be divided into three zones comprising:
a first zone defined between the AC power curtailment set point and the target value for the AC power;
a second zone defined between the target value for the AC power and a lower limit value for inverter power output reading at AC side; and
a third zone defined below the lower limit value for inverter power output reading at AC side.

4. The method of claim 3, further comprising:
when in the first zone, increasing the DC-to-DC converter set point to increase energy storage charge power to harvest more photovoltaic energy into the energy storage or decrease energy storage discharge power to reduce energy storage power output into an AC system;
when in the second zone, maintaining the DC-to-DC converter set point; and
when in the third zone, decreasing the DC-to-DC converter set point.

5. The method of claim 1, further comprising:
comparing the forecasted energy flow information and the energy storage status information to determine if the energy storage has enough capacity to accommodate forecasted energy flow, wherein
if the forecasted energy flow information indicates positive forecasted energy flow and the energy storage has not enough available free capacity to accommodate the forecasted energy, then increasing the target value for the AC power; and
if the forecasted energy flow information indicates negative forecasted energy flow and the energy storage has not enough available stored energy capacity to supply the forecasted energy, then decreasing the target value for the AC power.

6. The method of claim 1, further comprising:
receiving a spinning reserve value indicating amount of spinning reserve required;
determining initial target value for AC power base point by subtracting the spinning reserve value from a photovoltaic inverter rated power value;
comparing the forecasted energy flow information and the energy storage status information to determine if the energy storage has enough capacity to accommodate forecasted energy, wherein
if the forecasted energy flow information indicates positive forecasted energy flow and the energy storage has not enough available free capacity to accommodate the forecasted energy, then increasing the target value for the AC power base point; and
if the forecasted energy flow information indicates negative forecasted energy flow and the energy storage has not enough available stored energy capacity to supply the forecasted energy and the spinning reserve, then decreasing the target value for the AC power base point.

7. The method of claim 1, further comprising:
receiving a frequency regulation value indicating a range of frequency regulation required;
determining initial target value for the AC power by subtracting a half of the frequency regulation value from a photovoltaic inverter rated power value;
comparing the forecasted energy flow information and the energy storage status information to determine if the energy storage has enough capacity to accommodate forecasted energy, wherein
if the forecasted energy flow information indicates positive forecasted energy flow and the energy storage has not enough available free capacity to accommodate the forecasted energy, then increasing the target value for the AC power; and
if the forecasted energy flow information indicates negative forecasted energy flow and the energy storage has not enough available stored energy capacity to supply the forecasted energy and the spinning reserve, then decreasing the target value for the AC power.

8. The method of claim 1, further comprising:
transmitting, to the energy storage manager, command to connect or disconnect battery strings of the energy storage to the DC bus;
receiving, from the energy storage manager, DC current limits in both charge and discharge directions in real time; and
receiving, from the energy storage manager, battery status readings including at least one of the following: DC voltages and state of charge.

9. The method of claim 1, further comprising:
transmitting at least one of remote stop command and start command to the DC-to-DC converter;
transmitting operation mode control commands to the DC-to-DC converter;
transmitting power set point or current set point to the DC-to-DC converter;
transmitting maximum DC current limits for the second direct current (DC) port in both charge and discharge directions to the DC-to-DC converter; and
receiving, from the DC-to-DC converter, status information and power readings of a first direct current (DC) port and the second direct current (DC) port.

10. The method of claim 1, wherein the DC-to-DC converter is run in a current source mode and configured to follow voltage of a photovoltaic DC bus set by the inverter.

11. The method of claim 1, further comprising:
transmitting at least one of remote stop command and start command to the inverter;
transmitting AC power curtailment set point to the inverter; and
receiving inverter status information and power readings at both AC side and DC side from the inverter.

12. The method of claim 1, further comprising:
transmitting, to the energy storage manager, command to connect or disconnect battery strings of the energy storage to the DC bus;
receiving, from the energy storage manager, DC current limits in both charge and discharge directions in real time; and
receiving, from the energy storage manager, battery status readings including at least one of the following: DC voltages and state of charge.

13. A controller apparatus for controlling a power plant system, the power plant system including a photovoltaic power source configured to provide photovoltaic DC power to a photovoltaic DC bus, the photovoltaic power source including an inverter including a direct current (DC) power input operationally connected to the photovoltaic DC bus to receive photovoltaic DC power, and an alternating current (AC) power output for supplying AC power to an AC system, a DC-to-DC converter including a first direct current (DC) port to be operationally connected to the photovoltaic DC bus in parallel with the photovoltaic power source, an energy storage and an energy storage manager operationally connected to a second direct current (DC) port of the DC-to-DC converter, the controller apparatus comprising:
a communication interface configured to transceive information with the inverter, the DC-to-DC converter and the energy storage manager;
at least one processor; and
at least one memory including computer program code;
the at least one memory and the computer program code configured to, with the at least one processor, cause the apparatus to:
receive target value for AC power to be supplied by the inverter;
receive weather forecast information, energy storage status information and photovoltaic power source parameters;
generate forecasted energy flow information for the photovoltaic power source based on the weather information and the photovoltaic power source parameters;
compare the forecasted energy flow information and the energy storage status information; and
adjust the target value for the AC power based on the comparison.

14. A power plant system comprising:
a photovoltaic power source to provide photovoltaic DC power to a photovoltaic DC bus;
an inverter comprising a direct current (DC) power input operationally connected to the photovoltaic DC bus to receive photovoltaic DC power, and an alternating current (AC) power output for supplying AC power to an AC system;
a DC-to-DC converter comprising a first direct current (DC) port to be operationally connected to the photovoltaic DC bus in parallel with the photovoltaic power source;
an energy storage operationally connected to a second direct current (DC) port of the DC-to-DC converter;

an energy storage manager operationally connected to the energy storage for monitoring and controlling the energy storage; and a controller apparatus coupled to the inverter, the DC-to-DC converter and the energy storage manager, configured to:

receive target value for the AC power to be supplied for the AC system;

receive weather forecast information, energy storage status information and photovoltaic power source parameters;

generate forecasted energy flow information for the photovoltaic power source based on the weather information and the photovoltaic power source parameters;

compare the forecasted energy flow information and the energy storage status information; and adjust the target value for the AC power based on the comparison.

* * * * *

UNITED STATES PATENT AND TRADEMARK OFFICE
CERTIFICATE OF CORRECTION

PATENT NO. : 10,559,960 B2  
APPLICATION NO. : 15/911752  
DATED : February 11, 2020  
INVENTOR(S) : Sen Zhang Page 1 of 2

It is certified that error appears in the above-identified patent and that said Letters Patent is hereby corrected as shown below:

Columns 19 and 20, Claim 1, should read as follows:
1. A computer implemented method for controlling a power plant system, the power plant system including a photovoltaic power source configured to provide photovoltaic DC power to a photovoltaic DC bus, an inverter including a direct current (DC) power input operationally connected to the photovoltaic DC bus to receive photovoltaic DC power, and an alternating current (AC) power output for supplying AC power to an AC system, a DC-to-DC converter including a first direct current (DC) port to be operationally connected to the photovoltaic DC bus in parallel with the photovoltaic power source, an energy storage and an energy storage manager operationally connected to a second direct current (DC) port of the DC-to-DC converter, the method for controlling the power plant system comprising:
    receiving a target value for the AC power to be supplied by the inverter;
receiving weather forecast information, energy storage status information and photovoltaic power source parameters;
    generating forecasted energy flow information for the photovoltaic power
source based on the weather information and the photovoltaic power source parameters;
    comparing the forecasted energy flow information and the energy storage
status information; and
    adjusting the target value for the AC power based on the comparison.

Column 22, Claim 13, should read as follows:
13. A controller apparatus for controlling a power plant system, the power plant system including a photovoltaic power source configured to provide photovoltaic DC power to a photovoltaic DC bus, an inverter including a direct current (DC) power input operationally connected to the photovoltaic DC bus to receive photovoltaic DC power, and an alternating current (AC) power output for supplying AC power to an AC system, a DC-to-DC converter including a first direct current (DC) port to be operationally connected to the photovoltaic DC bus in parallel with the photovoltaic power source, an energy storage and an energy storage manager operationally connected to a second direct current (DC) port of the DC-to-DC converter, the controller apparatus comprising:
    a communication interface configured to transceive information with the inverter, the Signed and Sealed this  
Twenty-fourth Day of March, 2020

Andrei Iancu  
*Director of the United States Patent and Trademark Office*

DC-to-DC converter and the energy storage manager;
   at least one processor; and
   at least one memory including computer program code;
   the at least one memory and the computer program code configured to, with the at least one processor, cause the apparatus to:
      receive target value for AC power to be supplied by the inverter;
      receive weather forecast information, energy storage status information and photovoltaic power source parameters;
      generate forecasted energy flow information for the photovoltaic power source based on the weather information and the photovoltaic power source parameters;
      compare the forecasted energy flow information and the energy storage status information; and adjust the target value for the AC power based on the comparison.